United States Patent
Hudson et al.

(10) Patent No.: US 6,555,840 B1
(45) Date of Patent: Apr. 29, 2003

(54) CHARGE-TRANSPORT STRUCTURES

(75) Inventors: Andrew James Hudson, Oxfordshire (GB); Sally Anderson, Oxford (GB); Michael Stuart Weaver, Cheshire (GB); Craig Tombling, Oxfordshire (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/504,557

(22) Filed: Feb. 15, 2000

(30) Foreign Application Priority Data

Feb. 16, 1999 (GB) .............................................. 9903389

(51) Int. Cl.⁷ .............................................. H01L 51/20
(52) U.S. Cl. ........................ 257/40; 257/102; 257/103; 313/498; 313/499; 313/500; 313/506; 313/507; 313/509; 313/511
(58) Field of Search ......................... 257/40, 102, 103; 313/498–500, 506–507, 509, 511

(56) References Cited

U.S. PATENT DOCUMENTS

| | | | |
|---|---|---|---|
| 5,674,597 A | * 10/1997 | Fuji et al. | 428/212 |
| 5,804,836 A | * 9/1998 | Heeger et al. | 257/448 |
| 5,895,692 A | * 4/1999 | Shirasaki et al. | 427/557 |
| 6,023,073 A | * 2/2000 | Strite | 257/40 |
| 6,075,317 A | * 6/2000 | Keyser et al. | 313/505 |
| 6,117,529 A | * 9/2000 | Leising et al. | 428/209 |
| 6,048,573 A | * 11/2000 | Tang et al. | 427/66 |
| 6,214,151 B1 | * 4/2002 | Chen et al. | 156/240 |
| 6,278,236 B1 | * 8/2002 | Medathil et al. | |

FOREIGN PATENT DOCUMENTS

| | | |
|---|---|---|
| EP | 0 554 569 A2 | 11/1993 |
| EP | 0 643 549 A1 | 3/1995 |
| EP | 892 028 | 1/1999 |
| EP | 1 017 118 | * 7/2000 |
| EP | 1 056 141 | * 11/2000 |
| EP | 1 083 612 | * 3/2002 |
| JP | 6-116552 | * 4/1994 |
| JP | 6 116552 | * 4/1994 |

OTHER PUBLICATIONS

European Search Report dated Jun. 5, 2002 in corresponding European Patent Application No. 00301196.2.
Granstroem et al., "Laminated Fabrication of Polymeric Photovoltaic Diodes", Nature, Macmillan Journals Ltd., London, GB, vol. 395, Sep. 17, 1998, pp. 257–260, XP000931238.
Fujii et al., "Organic Photovoltaic Cell With Donor–Acceptor Double Heterojunctions", Japanese Journal of Applied Physics, Publication Office Japanese Journal of Applied Physics, Tokyo, Japan, vol. 35, No. 11A, Nov. 1, 1996, pp. L1438–L–1441, XP000727737.
Pichler et al., "Field–Effect Transistors Based on Poly(P-Phenylene Vinylene) Doped by Ion Implantation", Journal of Applied Physics, American Institute of Physics, New York, US, vol. 77, No. 7, Apr. 1, 1995, pp. 3523–3527, XP000501594.

(List continued on next page.)

Primary Examiner—Nathan J. Flynn
Assistant Examiner—Ahmed N. Sefer
(74) Attorney, Agent, or Firm—Renner, Otto, Boisselle & Sklar, LLP

(57) ABSTRACT

A charge-transport structure, e g an opto-electronic structure such as an electroluminescent device is manufactured by forming a uniform first charge-transport (eg electron-transport) polymer layer on a substrate. Low molar mass dyes in a solvent are ink-jet printed onto the exposed surface of the first layer to form a multicolor pattern, and the dyes are allowed to diffuse into the layer to form charge-recombination/emitter regions within the layer. Excess dyes are washed away from the surface and then a uniform second charge-transport (eg hole-transport) polymer layer is formed on the resultant smooth surface of the first layer over the tops of the regions. Finally, electrodes are deposited on the top of the second layer in registration with the regions. Photovoltaic structures and organic transistors are also disclosed.

12 Claims, 4 Drawing Sheets

OTHER PUBLICATIONS

Shoustikov et al., "Electroluminescence Color Tuning By Dye Doping in Organic Light–Emitting Diodes", *IEEE Journal of Selected Topics in Quantum Electronics*, IEEE Service Center, US, vol. 4, No. 1, 1998, pp. 3–13, XP000766104.

Pschenitzka et al.; "Three Color Organic Light–Emitting Diodes Patterned by Masked Dye Diffusion"; *Appl. Phys. Lett.*, vol. 74, No. 13, Mar. 29, 1999, pp. 1913–1915.

Tada et al.; "Three–Color Polymer Light–Emitting devices Patterned by Maskless Dye Diffusion onto Patterned Electrode"; *Jpn. J. Appl. Phys.*, vol. 38; 1999; L.1143–1145.

J.C. Sturm et al.; "Printing Approaches for Large–Area Color Organic LRD Displays"; *SPIE*, vol. 3797; Jul. 1999; pp. 266–273.

\* cited by examiner

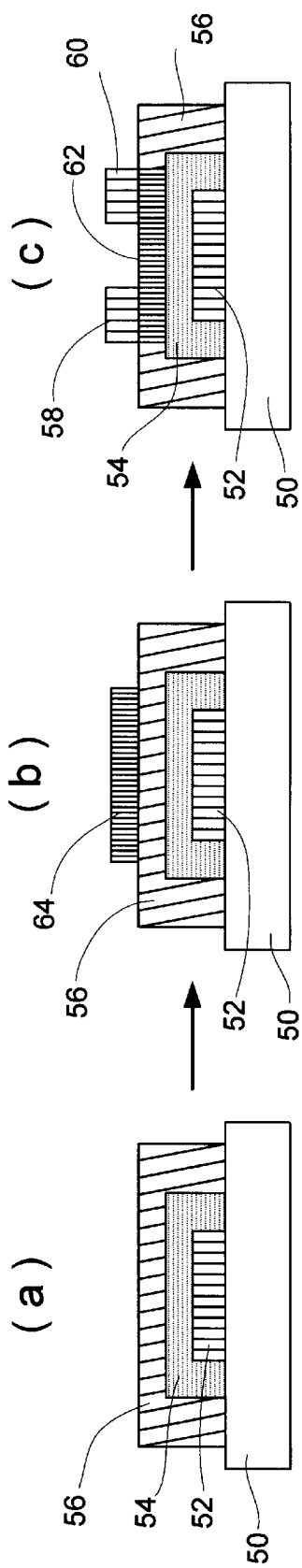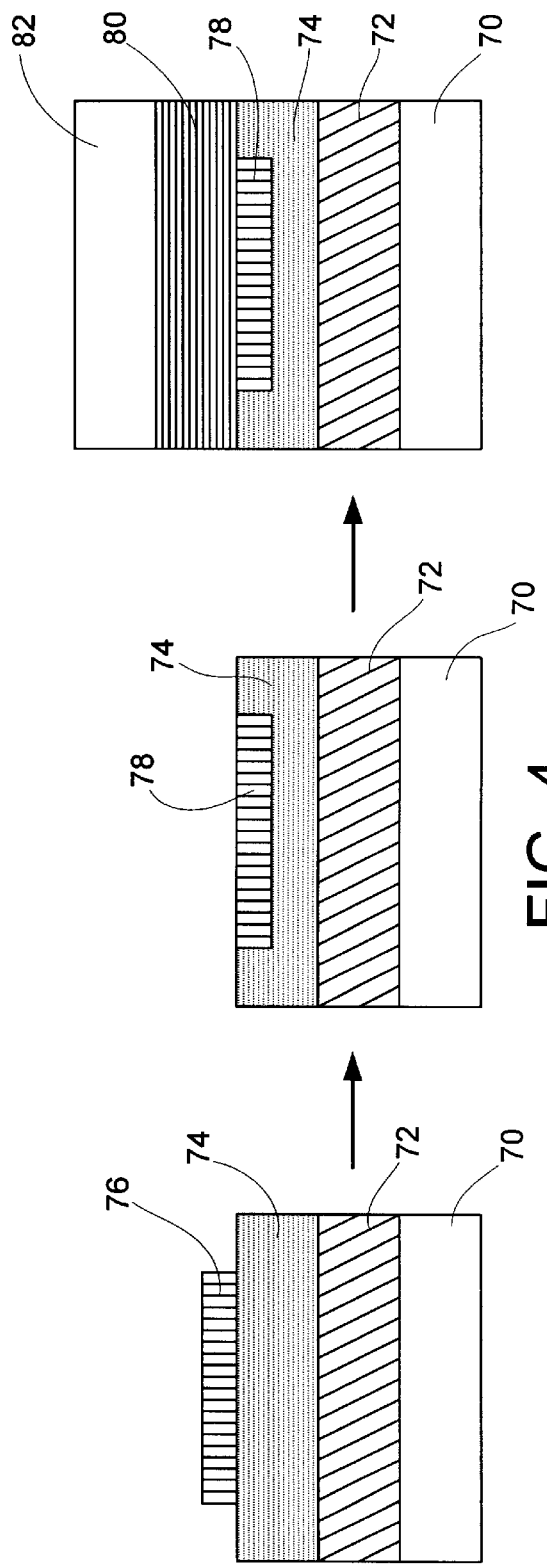
FIG. 3
FIG. 4

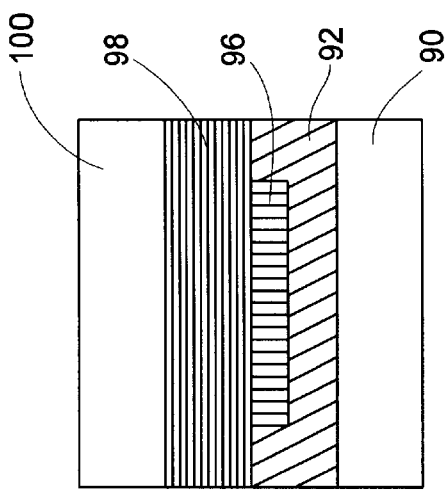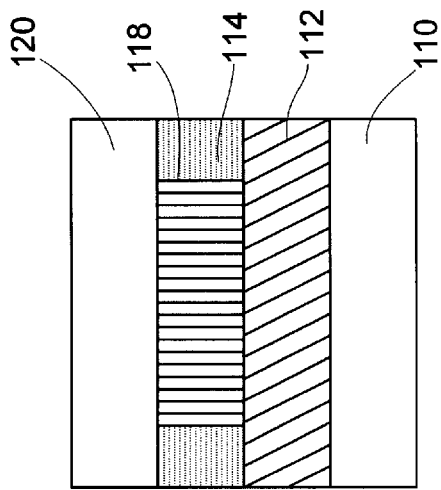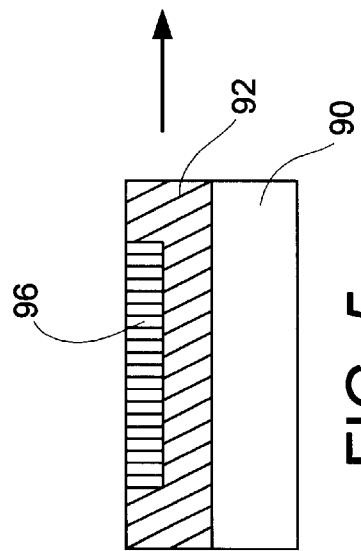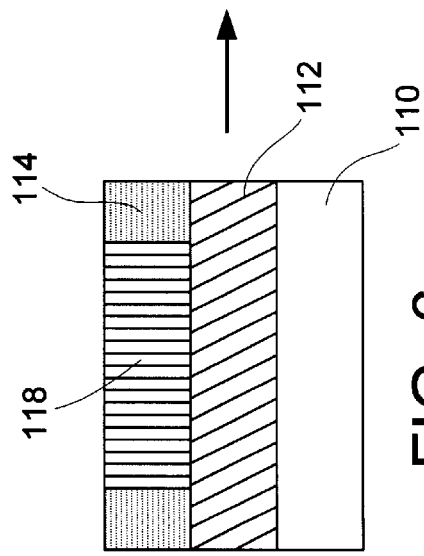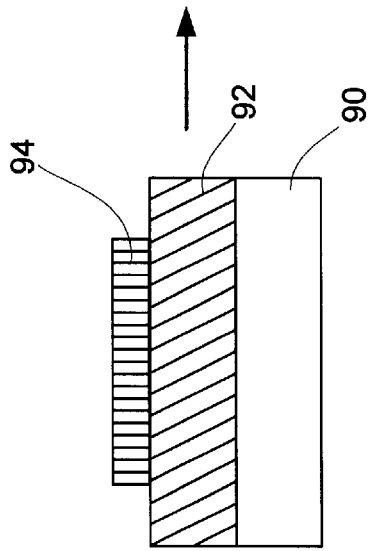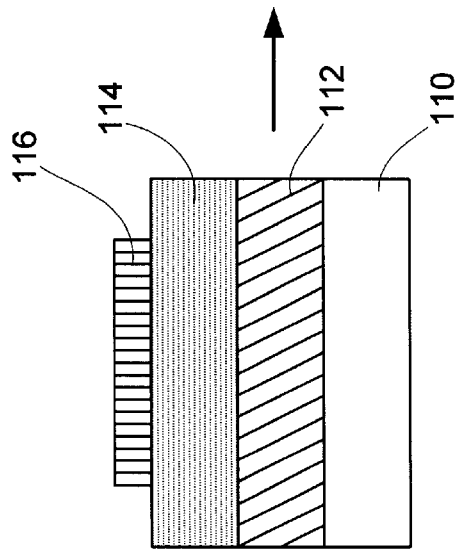
FIG. 5
FIG. 6

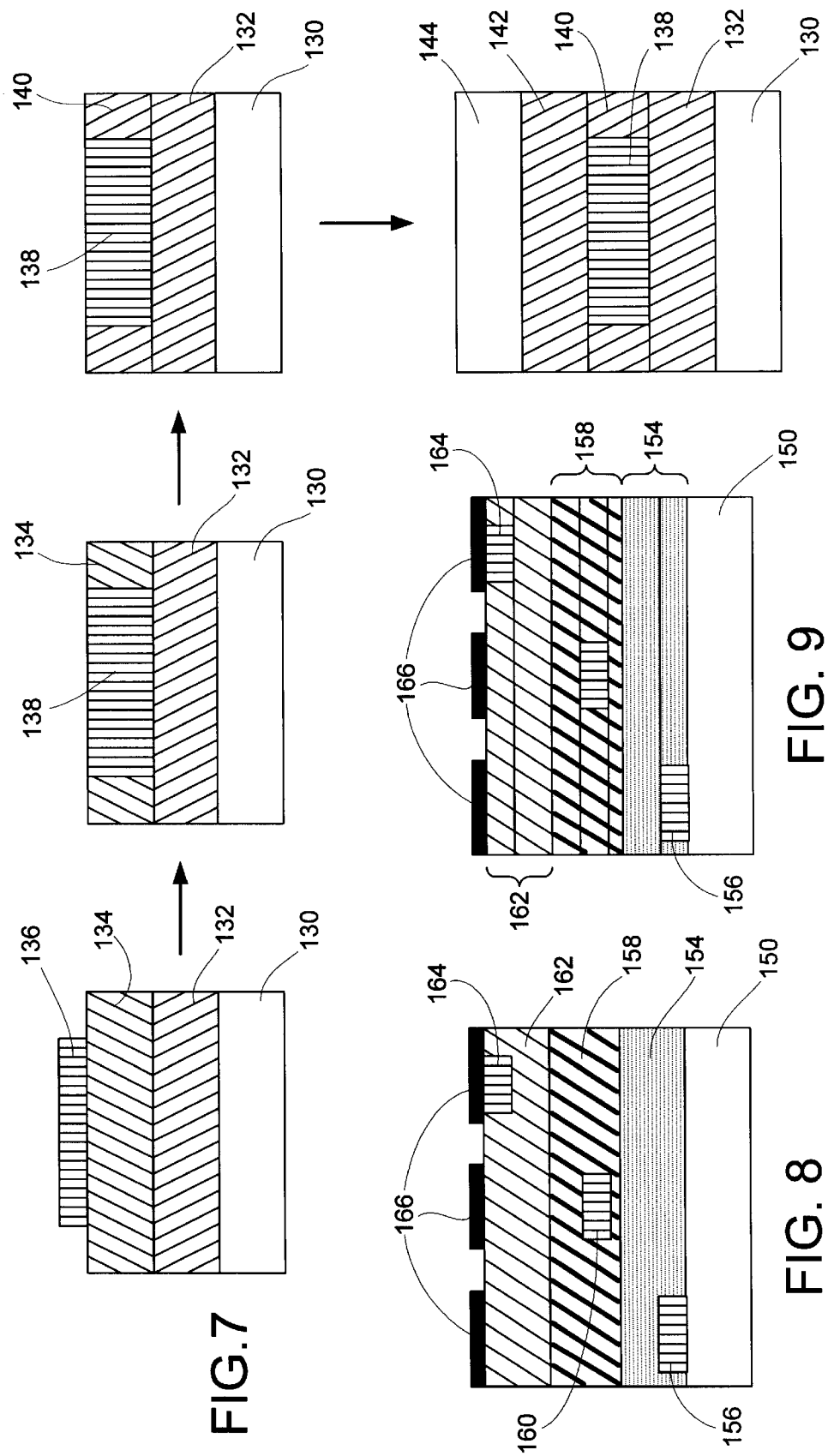

CHARGE-TRANSPORT STRUCTURES

BACKGROUND OF THE INVENTION

1. Field of the Invention

This invention relates to charge-transport structures and to a method of manufacturing such structures. This invention is especially concerned with organic electro-luminescent structures but also has application in other organic optoelectronic structures such an organic photo-voltaic devices, and in organic transistors and other electronic structures where charge flows through the structure in operation.

2. Description of the Related Art

An organic electro-luminescent structure is disclosed by C. W. Tang et al in Appl. Phys. Lett. 51(12), Sep. 21, 1987, pages 913 to 915, in which an aromatic diamine layer is vacuum deposited onto an indium tin oxide-coated glass substrate. An 8-hydroxyquinoline aluminium (Alq) layer is vacuum deposited on top of the diamine layer and an Mg:Ag electrode is deposited on top of the Alq layer. The diamine layer is a hole-transport layer whilst the Alq layer is an electron transport layer. In use, holes are injected via the indium tin oxide layer into the diamine layer whilst electrons are injected via the Mg:Ag electrode into the Alq layer. Recombination of holes and electrons takes place in the Alq layer adjacent to its interface with the diamine layer so as to produce light emission in the 500–600 nm region.

J. H. Burroughes et al in Nature, vol. 347, Oct. 11, 1990, pages 539 to 541, disclose organic electro-luminescent structures based on a layer of poly(p-phenylene vinylene) [PPV] sandwiched between top and bottom electrodes. The PPV layer is formed by spin-coating a thin film of PPV precursor followed by thermal conversion to form the PPV layer. In use, such structure emits in the green-yellow part of the spectrum.

C. W. Tang et al in J. Appl. Phys. 65(9), May 1, 1989, pages 3610 to 3616, disclose organic electro-luminescent structures similar to those disclosed by C. W. Tang et al (supra) but where a layer of doped Alq is provided at the interface between a diamine layer and an undoped Alq layer, or is provided within the undoped Alq layer adjacent to the interface. The doped Alq layer is produced by evaporation of Alq and dopant at different deposition rates. The concentration of dopant affects the emission wavelength of the structure.

M. Matsuura et al in Asia Display '95, pages 269 to 272, disclose multi-colour organic electro-luminescent structures based on a blue emitting layer which is modified in certain regions with colour changing media (CCMs) which change the emission colour from blue to green or red to enable an RGB colour display to be obtained. The blue emitting structure is obtained using ITO as an anode, an unspecified hole-transport layer, an electron-transporting layer consisting of 1,4-bis(2,2-diphenylvinyl)biphenyl [DPVBi], with an Mg:Ag cathode. The CCMs are deposited by a patterned printing technique on a glass plate. The patterned CCMs are then covered by a protecting layer followed by formation of the ITO anode, the organic hole-transport and electron-transport layers. Thus, in this structure, the CCMs are disposed on the opposite side of the anode to the organic charge-transport layers and are encapsulated in a protecting layer.

J. Bharathan et al in Applied Physics Letters, volume 72, No. 21, pages 2660 to 2662, disclose organic electroluminescent devices wherein red-, green- and blue-emitting polymers are printed in the desired pattern on a substrate by ink-jet printing. In this structure, a layer consisting of the desired pattern, for example red-green-blue dots for a multicoloured display, is printed on to a substrate and then a polymer is spin-coated over the top of the pattern to form a uniform buffer layer which seals pin-holes in the ink-jet printed layer. In a particular example, an aqueous solution of polyethylenedioxy thiophene is ink-jet printed onto an ITO electrode formed on a substrate to produce the desired pattern. Then, the pattern to covered with a spin-cast film of poly[2-methoxy-5-2'-ethylhexyloxy-1,4-phenylene vinylene]. However, the provision of the dots adjacent to the ITO electrode can lead to undesirable quenching of emission in use.

Chang et al, Appl. Phys. Lett., Vol 73. No. 18, Nov. 2, 1998, pages 2561 to 2563, disclose the production of patterned dual-colour polymer light-emitting pixels using hybrid ink-jet printing technology where a hole-injection layer of spin-cast polyaniline is formed on an ITO anode supported by a glass substrate. Subsequently, a polymer buffer layer of a wide band gap, water-soluble blue emitting polymer, poly[2,5-bis[2-(N,N,N-triethylammonium) ethoxy]-1,4-phenylene-alt-1,4-phenylene] dibromide [PPP-NET$_3^+$], is spin cast onto the polyaniline layer. Such a structure emits blue light in use. An ink-jet printer is used to print dots of a red-orange emitting, water-soluble polymer, poly(5-methoxy-(2-propanoxysulfonide)-1,4-phenylene vinylene) (MPS-PPV). The MPS-PPV is dissolved in an aqueous solution and diffuses into the spin-cast buffer layer of PPP-NET$_3^+$. Then, cathodes are deposited on top of the buffer layer to complete the structure. However, the techniques described by Chang et al do not ensure that the surface of the buffer layer on which the cathodes are deposited is completely smooth. Thus, there is still a risk that the cathodes will be non-uniform leading to so-called "edge effects" and to a poor service life. Also, the provision of the dots adjacent to the cathodes can lead to undesirable quenching of emission in use.

Hebner et al in Appl. Phys. Lett., vol. 72, No. 5, Feb. 2, 1998, pages 519 to 521, disclose an organic light emitting structure in which ink-jet printing is used to apply a patterned layer of polyvinylcarbazole doped with various types of coloured dye onto an ITO anode supported on a polyester substrate. The ink-jet printer is operated in a mode to create a continuous sheet of polymer rather than discrete dots so as to facilitate subsequent formation of metal cathodes over the top of the ink-jet printed layer. However, it it difficult, when ink-jet printing, to avoid the formation of pin holes even when operating the ink-jet printer in a mode to create a continuous sheet of polymer. This produces non-uniform electrodes leading to so-called "edge effects" and to a poor service life. Also, the provision of the dots adjacent to the cathodes can lead to undesirable quenching of emission in use.

In an attempt to overcome the problem of undesirable thickness non-uniformities, it has been proposed by T. Hebner et al in a presentation of Materials Research Society —Fall Meeting, Boston, USA, Nov. 30–Dec. 4, 1998, see the Abstract on page 366, and T. R. Hebner et al in Appl. Phys. Lett, vol. 72, No. 13, Sep. 28, 1998, pages 1775 to 1777, to achieve local tuning of the ultra-violet fluorescence and electro-luminescence by local application of wet dye-containing droplets after a uniform organic film is created by spin-coating. In the Abstract, there is described a method of diffusing dopants into a PVK host polymer layer, wherein the dopants are C47, C6 and nile red dopants for blue, green and red devices. In such method, an ink-jet printer is used and the solvent is said to be compatible with ink-jet printers. However, solvents such as acetone are employed, which is reported to create a hole in the polymer film. The use of acetone leads to significant lateral transport of the dyes through the film leading to build-up at the edges. The films are very thin and the dye diffuses all the way through the film. As a result, the PVK host layer is basically uniformly doped throughout the thickness of the film.

EP-A-0643549 describes an internal junction organic electroluminescent device in which an organic electroluminescent medium disposed between an anode and a cathode has a hole injecting and transporting layer contiguous with the anode and an electron injecting and transporting layer contiguous with the cathode. The electron injecting and transporting layer includes an electron injecting layer in contact with the cathode. Between the electron injecting layer and the hole injecting and transporting layer, the organic electroluminescent medium is capable of emitting white light in response to hole-electron recombination and comprises a fluorescent material and a mixed ligand aluminium chelate of a specified general formula. The injecting and transporting layers are described as being formed by thermal vapour deposition in a vacuum chamber. The dopants in such layers are co-deposited at the same time, leading to uniform doping throughout the layers.

EP-A-0554569 discloses an electroluminescent device in which vapour deposition of the layers of the device is described, with an aluminium chelate doped with a fluorescent dye being co-deposited as one of the layers, leading to uniform doping throughout such layer.

SUMMARY OF THE INVENTION

According to one aspect of the present invention, there is provided an organic optoelectronic structure comprising an organic charge-transport layer arrangement having (a) an electron-transport region at one surface, (b) a hole-transport region at an opposite surface, and (c) at least one active region, wherein the or each active region is defined by a diffused region of the organic charge-transport layer arrangement into which at least one dopant has diffused, said diffused region extending only partly through the thickness of said layer arrangement.

In one embodiment, the organic charge-transport layer arrangement comprises a substantially uniform first organic charge-transport layer, a substantially uniform second organic charge-transport layer disposed on the first organic layer, an interface between said first and second organic layers, one of the organic layers defining the hole-transport region and the other organic layer defining the electron-transport region, and a plurality of active regions at the interface, wherein the or each active region is provided at the interface.

In another embodiment, the organic charge-transport layer arrangement comprises a single organic layer having the electron-transport region and hole-transport region extending into the layer from opposite surfaces thereof, and said at least one active region is diffused into the layer from one of said surfaces.

In the case of an electroluminescent display structure, a plurality of localised active regions may be provided which can be individually addressed.

In the case of a photovoltaic structure, a single active region may be provided which extends over the majority of the length and width of the organic charge-transport layer arrangement.

According to another aspect of the present invention, there is provided a method of manufacturing an optoelectronic structure comprising the steps of:

applying at least one dopant to a surface of an organic layer arrangement;

causing said at least one dopant to diffuse into said surface so as to define at least one active region within said layer arrangement which extends only partially through the thickness of the latter;

and removing excess dopant from the surface.

In one embodiment, the method comprises forming a substantially uniform first layer of an organic charge-transport material;

applying said at least one dopant on a surface of the first layer; and providing a substantially uniform second layer of an organic charge-transport material of opposite charge-type to that of the first organic layer over said surface of the first organic layer, so that said at least one active region is present at an interface between said first and second organic layers which define said organic layer arrangement.

In another embodiment, the organic layer arrangement comprises a single layer of organic material in which the electron-transport region, the hole-transport region and the active region(s) are formed by diffusion of respective dopants into the layer. The diffusion of the dopants may be effected in any desired order. The source of the dopant which diffuses into the layer may be an electrode in contact with the layer.

Electrodes provided on opposite sides of the charge-transport layer arrangement enable infection of holes and electrons so as to recombine within the active region(s) to produce light emission in the case where the structure is for use as a light emitter eg an electro-luminescent structure. Alternatively, electrodes on opposite sides of the layer arrangement enable a voltage signal to be obtained in the case where the structure is for use in photovoltaic devices where light incident upon the active regions causes charge separation.

Diffusion of the dopant(s) into the layer arrangement and the removal of excess dopant enables the surface into which diffusion takes place to be completely flat, thereby avoiding the problem of shadowing and breakdown at edges of the structure. Additionally, choice of the diffusion conditions and matching of the dopant, the solvent (when used) and the organic material into which the dopant is to be diffused can be made so as to ensure that diffusion is effected only locally so as to extend only partially through the layer arrangement. In electro-luminescent structures, this avoids the problem of quenching of the light emission from the dopants in use which occurs when the dopants forming the active region(s) are in contact with or in close proximity to the electrode. Thus, in the present invention, the emissive dopants can be kept away from the electrode without the need to provide any additional layer of electron transport material on top of the diffused layer before the electrode is formed.

Additionally, the localised diffusion of the dopants offers the potential to build up several "functional" layers, (for example one transport layer and an emissive layer) within a single organic layer by sequentially using different dopant baths or different dopant materials for localised diffusion. For example, the use of a dopant bath to diffuse one dopant over the entire organic layer may be followed by diffusion of another dopant into localised regions of the layer in accordance with the present invention. Alternatively, one dopant could be diffused into a localised region or regions followed by a second dopant into the same region(s). Using these techniques or a combination thereof, it is possible to have two or more diffusion profiles, one by an immersion technique over the whole of the organic layer to improve, for example, electron transport close to the adjacent electrode, and a second by localised diffusion to provide or improve photoemission or photoabsorption at the centre of the polymer layer. The organic material into which diffusion of dopant takes place may be a polymer containing a proportion (eg 1%, 2% or 3%) of sites which are capable of reacting with the dopant. Thus, diffusion can then be effected to bond the dopant(s) to the reactive sites so as to dope the polymer with the appropriate dopant concentration(s) (1%, 2% or 3%, for example). The binding of the dopant to the reactive sites enables a particular dopant profile to be achieved and helps to prevent further diffusion which might otherwise occur at the high temperatures produced during operation of the device. The polymer and the dopant may be designed to bind covalently or electrostatically together to prevent further dopant diffusion during device operation. For example, the polymer may be provided with a percentage ionic groups (eg cationic groups) on the main polymer chain, and an ionic dopant of opposite polarity (eg anionic) could be ion exchanged with a counter-ion (eg a bromide counter-ion) electrostatically bound to the cationic groups. The dopant would then be held electrostatically in place and unlikely to diffuse further.

In an alternative embodiment, a first part of the layer is formed of a polymer into which the dopant is substantially incapable of diffusing, a second part of the layer is initially formed of a polymer precursor into which the dopant is capable of diffusing, the dopant is diffused through at least part of said second part, and the polymer precursor containing the diffused dopant in said second part is then converted to the polymer so that the final layer consists of or comprises said first and second parts where the first part is undoped.

For example, the dopant and the polymer precursor may be hydrophilic whilst the polymer is hydrophobic, or the dopant and the polymer precursor may be hydrophobic whilst the polymer is hydrophilic.

In a preferred example, a first sub-layer is formed of a polymer into which the dopant is substantially incapable of diffusing;

a second sub-layer is initially formed of a precursor of the polymer into which the dopant is capable of diffusing; the dopant is diffused through at least part of the second sub-layer; and the polymer precursor containing the diffused dopant in the second sub-layer is then converted into the polymer so as to produce a final layer which comprises the first and second sub-layers, which is formed of substantially the same polymer, and in which the dopant is only diffused through part of its thickness.

At least one further sub-layer (formed of polymer or of the dopable polymer precursor) may be provided over the second sub-layer.

In the present invention, the depth of dopant diffusion into the thickness of the layer depends upon the materials and structure chosen. However, typically the dopant will be diffused through no more than about 30% of the thickness of the layer.

In the case of electroluminescent devices, the separation between the dopant and the adjacent electrode is typically greater than 5 nm to avoid undue quenching.

Some examples of suitable organic dye-type dopants are given below:

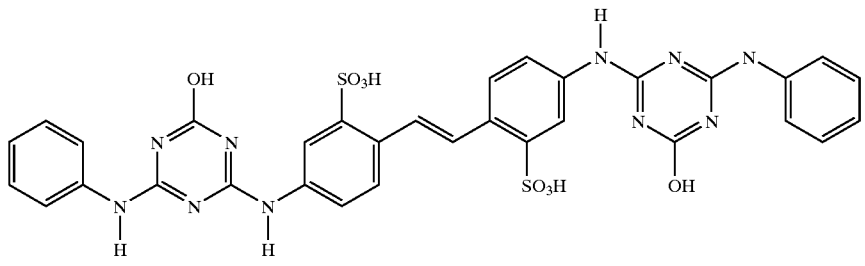

Stilbene

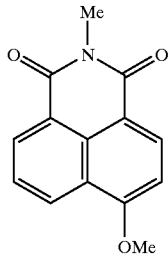

Naphthalimides

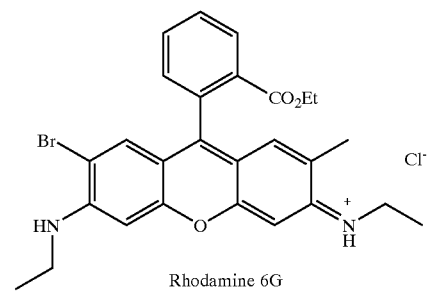

Rhodamine 6G

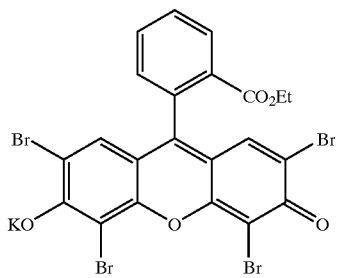

Ethyl eosin

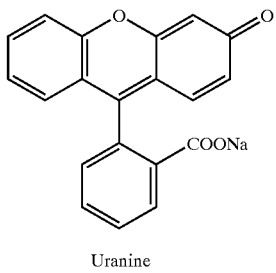

Uranine

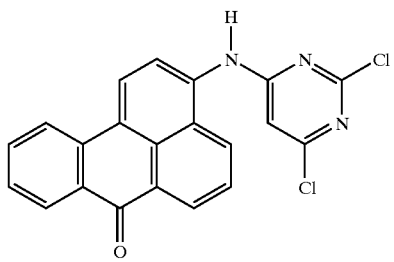

Reactive dye X,eg

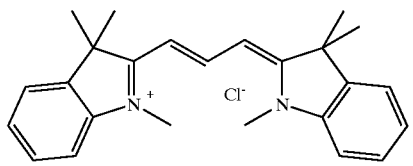

Cyanines eg

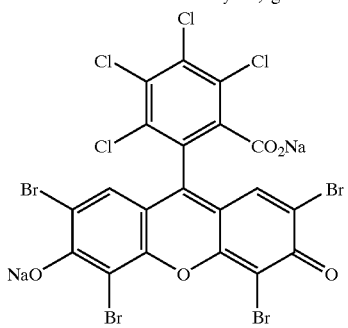

Phloxine B

The above organic dopants are of relatively low molar mass and so can be at least partially dissolved in a suitable solvent to enable them to be ink-jet printed, e.g. to form coloured stripes on the surface of the layer into which they are to be diffused. The required dopant concentration in the layer (typically a few percent in doped low molar mass systems) can be achieved simply by appropriate choice of the material of construction of the layer, the dopant molecule, and/or the diffusion conditions (such as the length of time allowed before removal of excess dopant and the temperature and/or pressure conditions). The provision and location of the dopant is divorced from the layer formation process, and hence the dopant may be localised within a specific layer. This has the advantage of allowing optimisation of the charge transport and emission properties separately. The technique allows ionic dopant (such as the Rhodamine series of dyes widely used in laser dyes, but not currently in electro-luminescent structures) to be incorporated into, for example, an ionic polymer system used to form the layer.

The or each dopant can be diffused from any solvent which will at least partially dissolve the dopant but which will not dissolve the relevant charge transport layer to any undesirable degree. In order to diffuse the dopant into the polymer from a solvent, it may be beneficial for the dopant to be more soluble in the polymer than in the solvent. Thus, the dopant may be only sparingly soluble in the solvent. For example, a dopant such as a fulgide dye may be diffused into polycarbonate from Fluorinert which is an inert fluorinated organic solvent. One way of forming a solution may involve dissolving the dopant in a good solvent to produce a concentrated solution and then adding a small amount of this concentrated solution to the solvent in which the dopant is only sparingly soluble.

When making multi-colour displays using, for example, ink jet printing to provide alternating stripes of red, green and blue dopants, any lateral diffusion of the dopants will lead to a build-up of dopant at the edges of the coloured strips. Many dopants such as DCM are emissive in dilute solutions but not in concentrated solutions due to concentration quenching. Thus, build-up of dopant at the edges of the coloured stripes will essentially lead to non-emissive highly absorbing regions which reduces the amount of cross-talk between neighbouring pixels.

With regard to the nature of the organic material into which the dopant is to be diffused, there is potentially a wide range of suitable hole- or electron-transporting polymers including the following:

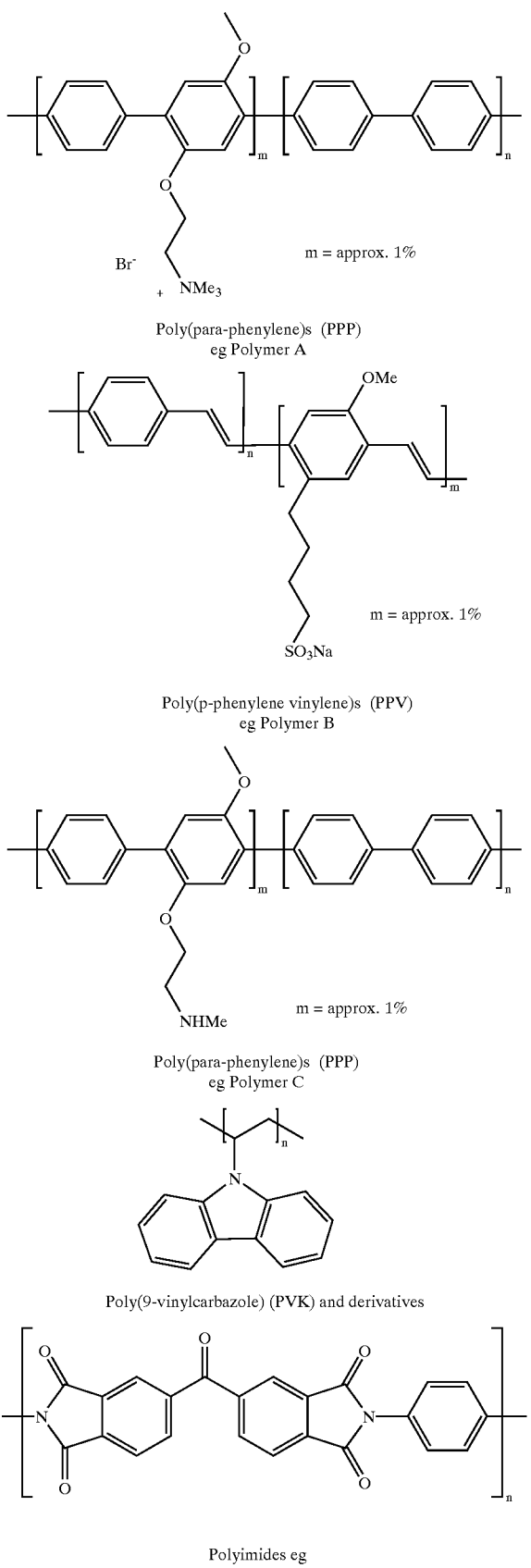

Poly(para-phenylene)s (PPP)
eg Polymer A

Poly(p-phenylene vinylene)s (PPV)
eg Polymer B

Poly(para-phenylene)s (PPP)
eg Polymer C

Poly(9-vinylcarbazole) (PVK) and derivatives

Polyimides eg

Polyamides e.g. nylon 6,6
Polyesters, and
Polystyrenes.

As an alternative to the use of a charge-transport polymer, a layer formed of a suitably cross-linked species (ie a species derived from a molecule, oligomer or polymer with two or more cross-linking groups attached which can react together to form a network) having charge transport properties may be employed. The formation of the network may be used to trap dye or other dopant molecules in specific regions of a device and prevent further dopant diffusion during device operation. The diffused dopant may also contain these cross-linking groups so that the dopant would be covalently incorporated into the polymer network during cross-linking. The organic material of the charge transport layer should only be sufficiently soluble in any solvent which may be used for the dopant to enable diffusion to take place to the desired extent. For example, if nylon is used, the solvent may be water.

If desired, one or both of the first and second organic layers may be deposited as layers which are not charge transport layers initially, but which are subsequently doped to impart the required charge-transport properties therein. Such doping in the first layer may be effected at the same stage as the active regions are formed and may be effected in selected regions of the first layer.

The dopant pattern on the surface of the organic layer arrangement may be provided by any suitable operation including ink-jet printing, bubble-jet printing, screen printing, contact printing, aerosol spraying, electrostatic spraying, electrochemical deposition and photochemical deposition. Ink-jet printing and bubble-jet printing may be used to generate tiny droplets of dye which when deposited onto a substrate polymer generate spatially defined red, green and blue areas, or pixels. In these deposition methods, the three colour types are deposited in a single process so that only a single registration event is required to align the colour pixels with any underlying electrode pattern. Screen printing, contact printing, aerosol spraying, electrostatic spraying, electrochemical deposition and photochemical deposition will usually require masks to define the areas for dye or other dopant diffusion on the polymer substrate. If three dye deposition steps are required, to generate the red, green and blue pixels, then the mask will have to be moved and aligned relative to the previously deposited areas of colour and the underlying electrode pattern. This latter procedure is considered to be particularly suitable for forming larger pixels.

Alternative dye or other dopant deposition methods to those outlined above are those that use the underlying electrode pattern to define the areas for dopant deposition. For example an electrode pattern adjacent to the organic layer may be used to define the areas in which dopant diffusion occurs. This technique uses heat generated in the electrode to promote diffusion directly above it as a current is passed through the electrode. There are other methods of generating localised heating, for example, an IR laser, with appropriate alignment between the heated areas, earlier coloured/doped areas and the underlying electrode pattern being required. Alternatively it is considered possible to use the underlying electrode pattern to build up a pattern of charged and uncharged areas on the surface of the organic layer, the charged areas being used to pick up dopant particles (in an analagous manner to toner particles used in photocopying), that may then diffuse into the organic layer.

The application of a bias to assist the diffusion of dye or other dopant species into the organic layer arrangement can be achieved readily in a passive matrix display. Here the electrodes that are initially formed on the substrate and overcoated with the host matrix material can be biased individually, all together, or in groups corresponding to RGB columns. The bias produces a potential at the surface of the organic layer arrangement, allowing localisation of the bias and subsequently the diffusion according to the electrode arrangement, i.e. in a self-aligned manner. In an active matrix display, the use of electrode patterns to self align areas where diffusion should take place becomes more complex. It is common for all of the row and column electrodes to be shorted by a ring around the edge of the display area, the shorting ring being removed as the display is completed. The shorting ring therefore allows indirect access to the pixel electrodes. Arranging shorting connections such that the rows are connected together and columns in three sets corresponding to red, green and blue pixels, allows bias to be applied to the three sets of columns of pixel electrodes. For example, with a bias applied to the red column shorting connector and a bias applied to a row shorting connector, the red pixels display a bias. This bias can be used as described above to assist the diffusion of dyes/dopants into successive regions of the layer arrangement in a self-aligned manner.

In a first example, red (for example ethyl eosin), green (for example uranine) and blue (for example stilbene 1) dyes in a suitable solvent (for example water) are deposited by ink-jet printing onto the surface of a polymeric hole transport layer (for example polymer A, a PPP with about 1% of units having a quaternary ammonium group attached) to form an RGB display. The pattern may be a series of stripes, possibly of different thicknesses for the red, green and blue subpixels. Other patterns, e.g. a delta arrangement such as is used on CRTs, are also possible.

In a second example, ionic dopants are diffused from aqueous solution into a polymer containing ionic groups such as Nylon 6,6 or a polymer with some anionic moieties (for example polymer A, a PPP containing a small proportion of units with quaternary ammonium groups). Anionic xanthene dyes such as ethyl eosin and Phloxine B may be used. The dopant molecules are electrostatically attracted to the polymer although hydrophobic and hydrogen bonding interactions may also be important in the interaction between the polymer and the dopants. The same technique may be applied using cationic dopants and a polymer with some anionic components (for example partially sulphonated PPV, polymer B). To maintain electrical neutrality, ion exchange may take place between the mobile counter ions of the polymer and the suitably charged dopant molecules. The degree of attraction between the system and the polymer may be controlled by varying the pH and the ionic strength, and hence the degree of doping.

In a third example, dopant can be diffused from inert solvent (such as Fluorinert) into polymers such as CR-39 (polyallyl diglycol carbonate), PMMA (polymethylmethacrylate) or PVK. Examples of such dopants are dyes such as cyanine and naphthalimide dyes. Hydrophobic, van der Waals' and/or hydrogen bonding interactions may be used to attach the dopant to the polymer.

Alternatively, a reactive dopant (for example reactive dye X) may be diffused from an inert solvent (for example chloroform) into the polymer such as polymer C. The dopant then reacts with the polymer to form a covalent bond.

The charge transport layers can be produced by any desired technique such as spin coating, dip coating, doctor blade coating or roll-to-roll coating. The technique is particularly well suited to mass-production using roll-to-roll coating on flexible polymer substrates. In this case, a patterned conducting polymer (such as polyaniline) is preferred rather than patterned ITO.

The present invention is applicable, *mutatis mutandis,* to other electronic structures, such as organic transistors, where charge flows through a doped organic semiconductor layer in operation. Thus, also according to the present invention, there is provided an electronic structure having an organic semiconductor layer and at least one doped site in the semiconductor layer, wherein the or each said doped site is defined by a region of the semiconductor layer into which at least one dopant has diffused, said region extending partially or completely through the thickness of said semiconductor layer.

The or at least one of the doped sites may be defined by a localised region of the semiconductor layer into which the dopant has diffused, and said region may extend only partially through the thickness of said semiconductor layer.

When the electronic structure is an organic transistor, it basically eg a field effect-transistor comprises an organic semiconductor layer with source, drain and gate electrodes. The organic semiconductor layer may for example be polythiophene doped selectively in a region between the source and drain electrodes with an oxidant such as 1,4-benzoquinone.

The present invention further resides in a method of manufacturing an electronic structure (eg an organic transistor), comprising the steps of:

forming a layer of an organic semiconductor material;

applying at least one dopant to a surface of the layer; and causing said at least one dopant to diffuse into the layer so as to define at least one doped site within the layer which extends partially or completely through the thickness of the latter.

The dopant may be applied to at least one localised site on said surface and the dopant may be caused to diffuse only partially through the thickness of the layer.

BRIEF DESCRIPTION OF THE DRAWINGS

The invention will now be described in further detail with reference to the accompanying drawings in which:

FIG. 3 to a schematic illustration showing stages in the preparation of an example of an organic field effect translator according to the present invention;

FIG. 4 is a schematic illustration showing various stages in an alternative method of manufacturing an electroluminescent structure according to the present invention;

FIG. 5 is a schematic illustration showing a further alternative method;

FIGS. 6 and 7 relate to other alternative methods;

FIG. 8 is a schematic illustration of another electroluminescent structure in accordance with the present invention; and FIG. 9 is a more detailed view illustrating the manner of construction of the electro-luminescent structure of FIG. 8.

DESCRIPTION OF THE PREFERRED EMBODIMENTS

Figure 1:
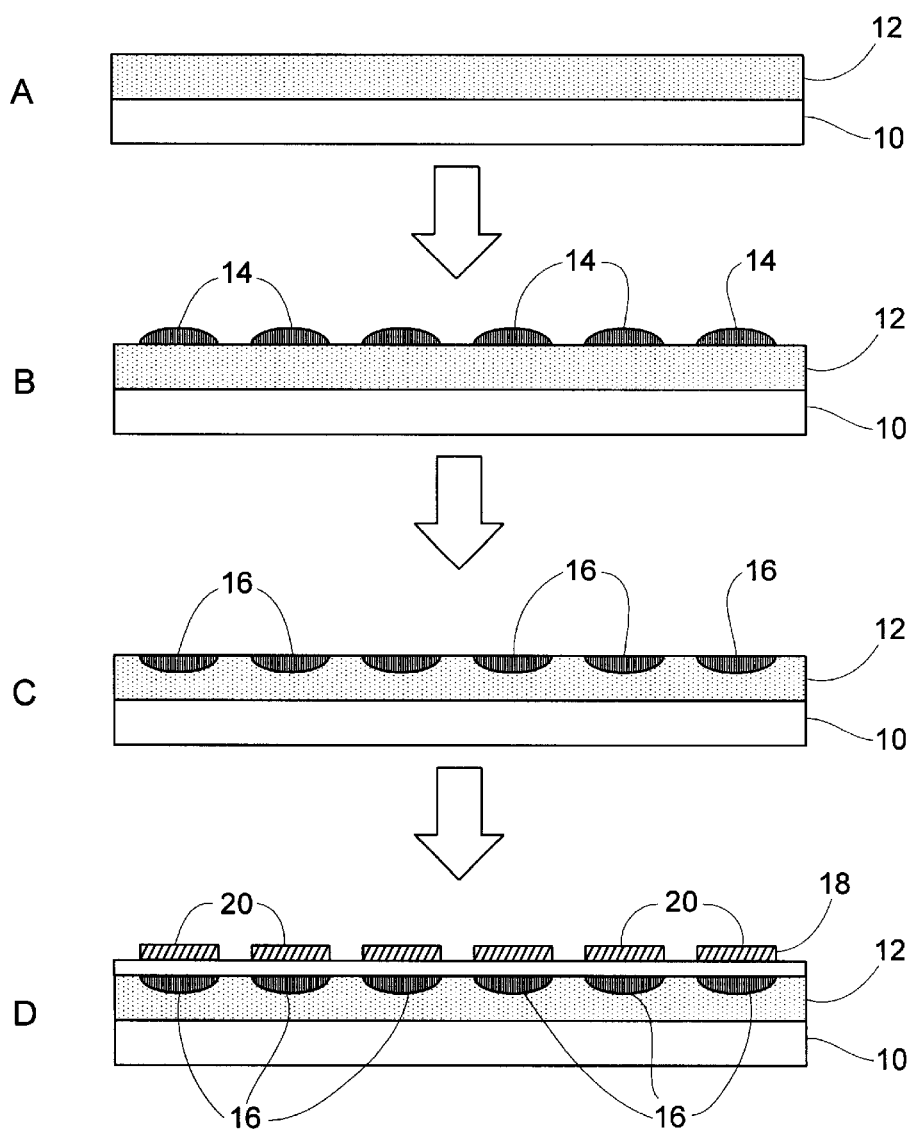
FIG. 1 is a schematic illustration showing various stages A to D in the manufacture of an electro-luminescent structure according to the present invention.

Referring now to FIG. 1 of the drawings, in stage A, a suitable substrate 10 (e.g. a transparent glass substrate) has a patterned conducting (e.g. ITO) film on an upper surface thereof to provide an electrode. A charge transport layer 12 is formed by uniformly coating a material of the desired charge-transport type onto the patterned substrate 10. The charge-transport material may be an electron-transport polymer or a hole-transport polymer.

Then, as shown in stage B, coloured stripes 14 of low molar mass dyes are deposited on to the exposed surface of the first layer 12 by an ink-jet printing process which utilises the dyes dissolved in a suitable solvent.

As shown in stage C, the printed dyes are allowed to diffuse into the first layer 12 for a predetermined period of time to form localised transport recombination/emitter regions 16 within the first layer 12 which extend only partially through the latter. After this predetermined period of time, excess dye solution is washed away from the surface of the first layer 12 so as to leave the localised regions 16 within the layer 12. As a result of this procedure, the exposed upper surface of the first layer 12 is completely smooth and in a condition, after drying as necessary, to receive a second polymer layer 18 of a material of opposite charge transport type to that used for the first layer 12.

As shown in stage D, the interface between the first and the second layers 12 and 18 is smooth and planar, and the second layer 18 is of uniform thickness and presents a smooth, planar exposed surface on which patterned electrodes 20 can be deposited in accurate registration with the sites 16 within the first layer 12. The provision of the second layer 18 between the transport recombination/emitter regions 16 and the electrodes 20 and the separation of the regions 16 from the ITO substrate 10 reduces the risk of emission quenching in use.

Additionally, any lateral diffusion of the dyes in the stripes 14 will lead to a build-up of dye along the longitudinal edges of the localised regions 16. In the case where the dyes are emissive in dilute solution but not in concentrated solution, this can lead to the formation of concentrated regions along the adjacent longitudinal edges of the regions 16 which are essentially non-emissive and highly absorbing. This reduced the amount of cross-talk between neighbouring pixels.

The above-described procedure is relatively simple to perform and is well-suited to low-cost production over large areas.

Figure 2:
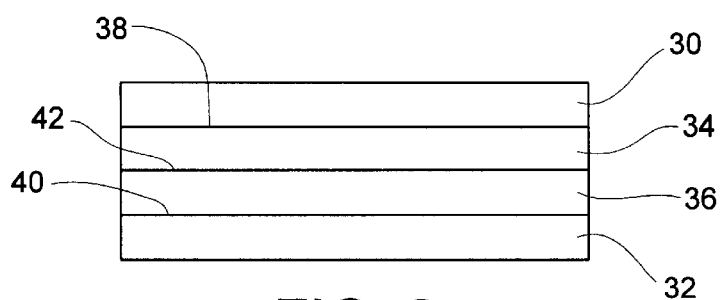
FIG. 2 is a schematic illustration of a photovoltaic device according to the present invention.

Referring now to FIG. 2 of the drawings, the photovoltaic device illustrated therein comprises a pair of glass substrates 30 and 32 between which are disposed charge transport layers 34 and 36. The layer 34 constitutes an electron acceptor layer, whilst the layer 36 constitutes a hole acceptor layer. Disposed between the substrate 30 and the layer 34 is an aluminium or calcium electrode 38. Disposed between the glass substrate 32 and the layer 36 is an ITO or PEDOT (polystyrene sulfonic acid) electrode 40. At the interface between the layers 34 and 36, there is provided a photoactive layer 42 which is diffused into the layer 34.

In the manufacture of such a structure, the electrode 38 can be formed by thermal evaporation of aluminium or calcium, followed by formation of the layer 34 on top of the resultant structure by spin-coating. Typically, the layer may be based on a cyano derivative of poly(p)-phenylene vinylene). The layer 42 may be formed by applying a dopant such as a porphyrin over the whole of the exposed surface of the layer 34 by dipping the structure into a bath containing a solution of the dopant, and then wiping the structure free of excess dopant so as to prevent diffusion of the dopant completely through the depth of the layer 34.

The ITO layer 40 may be provided by plasma deposition of ITO on the glass substrate 32, followed by spin-coating of the layer 36 which may, for example, be a phenyl-octyl substituted polythiophene.

Then, the two sub-structures are laminated together under pressure at elevated temperature in order to secure the exposed surfaces of the layers 34 and 36 together. Further details of a possible way of forming the electrodes 38 and 40 and the layers 34 and 36 are disclosed by M. Granstrom et al in Nature, Vol. 395, Sep. 17, 1998 page 257.

The diffused active region 42 enhances photoelectric conversion (i.e. absorption of light followed by charge carrier separation) at the interface between the layers 34 and 36 in use.

Referring now to FIG. 3 of the drawings, the organic field effect transistor illustrated therein comprises, in sequence, a substrate 50 which may be of glass or a polymeric material (e.g. polyethylene, polycarbonate or polyimide), a gate electrode 52, an insulating layer 54 (e.g. of polymethylmethacrylate), and a semiconductor layer 56. Source and drain electrodes 58 and 60 (see FIG. 3(c) are provided on the exposed surface of the semiconductor layer 56.

The semiconductor layer 56 may be formed of polythiophene which is locally doped by diffusion of an oxidant, such as 1,4-benzoquinone, in region 62 which is destined to be between the electrodes 58 and 60 in the completed device. Diffusion can be effected in accordance with the present invention by ink-jet printing a localised layer 64 of the oxidant on the surface of the layer 56 in a suitable solvent, followed by heating to promote diffusion, and then removal of excess material. The electrodes 58 and 60 are then formed on top of the thus doped layer 56. The contacts between the source and drain electrodes 58 and 60 and the semiconductor layer 56 may be further modified by dye diffusion of dopants into the semiconductor regions directly below the two electrode contacts.

The oxidant facilitates the formation of positive charges so that it is easier to turn on the FET when a negative DC gate voltage is applied to the gate electrode 52.

Either of the devices of FIGS. 2 and 3 may be provided on a flexible polymer substrate. Also, either of these devices may be constructed such that their manufacture does not involve laminating two substrates together.

Referring now to FIG. 4 of the drawings, the electroluminescent device illustrated therein is produced by providing a substrate 70 on which a metal cathode 72 is formed. A layer 74 of electron transport material is formed over the metal cathode 72 and a layer 76 of dye is provided over a region of the exposed upper surface of the layer 74. This layer 76 is then caused to diffuse completely into the layer 74 so as to form a diffusion region 78 which extends only partly through the depth of the layer 74. Then, a layer 80 of hole transport material is deposited onto the smooth surface of the layer 74 into which the dye 76 has diffused. Finally, an ITO anode 82 is provided on the layer 80.

The interface between the layer 80 and the diffused region 78 is smooth and defines an active region in which electron and hole recombination causes light emission in use.

In FIG. 5, an ITO-coated substrate 90 is coated with a layer 92 of a PPV polymer or a blend of PPV and PBD (2-(4-biphenylyl)-5-phenyl-1,3,4-oxadiazole).

A layer 94 of dye to be diffused into the layer 92 in printed onto a region of the upper surface of the latter. After diffusion, the resultant doped zone 96 extends only partly through the thickness of the layer 92. Following this, a PBD layer 98 is deposited over the resultant smooth upper surface of the layer 92, and then a metal cathode 100 it provided on the layer 98 to complete the structure.

Referring now to FIG. 6, an ITO coated substrate 110 is coated with a PEDOT layer 112, followed by a polyfluorene layer 114. An example of a typical repeating unit of a polyfluorene is given below:

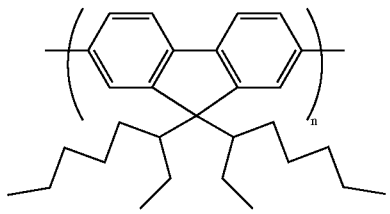

Following this, a dopant layer 116 to modify the charge transport properties of the polymer is printed onto the upper surface of the layer 114 and caused to diffuse into the latter to form a doped region 118 which, in this embodiment, extend throughout the thickness of the layer 114, but which may extend only partially through the thickness of the layer 114. Finally, a metal cathode 120 is provided on top of the layer 114.

Referring now to FIG. 7 of the drawings, an ITO-coated substrate 130 is covered with a layer 132 of a PPV polymer. Following this, a layer 134 of a PPV polymer precursor is deposited onto the layer 132. A dopant layer 136 is then printed onto a region of the layer 134 and caused to diffuse throughout the precursor polymer layer 134.

In this example, the dopant is chosen so that it interacts with the PPV polymer precursor. For example, the PPV polymer precursor may have structure shown below:

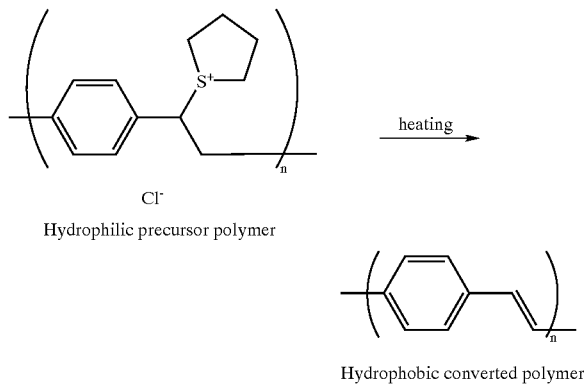

The above precursor polymer is soluble in, for example, water and methanol, and may be converted to a hydrophobic polymer by heating. The hydrophobic polymer is very insoluble in all solvents.

If the dye/dopant used for the layer 136 is hydrophilic, then it preferentially resides in the PPV polymer precursor layer 134 rather than migrating to the layer 132 which is not charged and which is hydrophobic. The resultant layer 134 with interacting dopant in region 138 is then cured to form a PPV polymer layer 140 which merges with the underlying PPV polymer layer 132. Following this, a further polymer layer 142 is provided over the layer 140. The layer 142 may likewise be formed of a PPV polymer or it may be a PBD layer or a blend of PPV and PBD. Finally, a metal cathode 144 is provided over the layer 142 to complete the structure.

Referring now to FIGS. 8 and 9 of the drawings, there is illustrated a structure comprising a substrate 150 coated with an ITO anode which in turn is coated with a hole transporting layer 154 including a localised region 156 of a hole-transporting dopant.

A layer 158 provided on the layer 154 includes a localised emissive dopant region 160 which is spaced from both the upper and lower major surfaces and from the edges of the layer 158. The region 160 can be provided within the layer 158 in a similar manner to the way in which the region 138 is provided within the layers 132, 140 and 142 in the embodiment of FIG. 7.

On top of the layer 158 is a layer 162 of an electron-transporting material including a localised electron-transporting dopant 164.

The layer 162 is topped by metal cathodes 166. One of the cathodes 166 contacts the region 164.

The region 156 may be formed in the layer 154 in an analogous manner to region 160 in layer 158. The layer 154 can be created in two steps. The first involves the formation of, for example, a hydrophilic precursor material layer into which hydrophilic dye/dopant will diffuse easily. Conversion of the hydrophilic precursor layer to a hydrophobic material then fixes the dye/dopant in region 156. A second layer of the same precursor material is then deposited and then converted to yield layer 154.

Clearly, the hydrophilic precursor material described above could be replaced by a hydrophobic precursor material, provided that a hydrophobic dye/dopant is used. Conversion could then yield a hydrophilic material that would trap the dye/dopant in region 156. A similar procedure is possible for layer 162 incorporating region 164. Generation of layer 162 would be carried out in two steps, the second involving a dye/dopant diffusion step.

In the above-described embodiments, ink-jet printing has been described for printing the required dopant/dye pattern on the layer into which it is to be diffused. However, it is possible *mutatis mutandis* to use any of the previously described alternative techniques, for example bubble-jet printing, screen printing, contact printing, aerosol spraying, electrostatic spraying, electrochemical deposition and photochemical deposition, for applying the dopant to be diffused.

What is claimed is:

1. An organic opto-electronic structure comprising an organic charge-transport layer arrangement having: (a) an electron-transport region at one surface, (b) a hole-transport region at an opposite surface, and (c) at least one active region, wherein the or each active region is defined by a diffused region of the organic charge-transport layer arrangement into which at least one dopant has diffused, said diffused region extending only partly through the thickness of said layer arrangement, wherein the organic charge-transport layer arrangement comprises a substantially uniform first organic charge-transport layer, a substantially uniform second organic charge-transport layer disposed on the first organic layer, an interface between said first and second organic layers, one of the organic layers defining the hole-transport region and the other organic layer defining the electron-transport region, and a plurality of active regions at the interface, wherein the or each active region is provided at the interface.

2. An opto-electronic structure according to claim 1, wherein the organic charge-transport layer arrangement is a polymer layer arrangement.

3. An opto-electronic structure according to claim 1, wherein said at least one dopant is a dye.

4. An opto-electronic structure according to claim 1, wherein the dopant is bound to the material of the layer into which it is diffused by a covalent bond, an electrostatic bond, a hydrophobic bonding interaction, a van der Waals' bonding interaction or a hydrogen bonding interaction.

5. An opto-electronic structure according to claim 4, wherein the dopant is bound by a covalent bond or an electrostatic bond.

6. An opto-electronic structure according to claim 1, further including a substrate upon which said layer arrangement is supported.

7. An opto-electronic structure according to claim 6, wherein the substrate is a flexible sheet of polymer or polymer/glass composite.

8. An opto-electronic structure according to claim 1, which is an electro-luminescent structure where the or each active region is a charge-carrier recombination/emitter region.

9. An opto-electronic structure according to claim 1, which is a photovoltaic structure wherein the or each active region to a light absorption/charge-carrier separation region.

10. An organic opto-electronic structure comprising an organic charge-transport layer arrangement having (a) an electron-transport region at one surface, (b) a hole-transport region at an opposite surface, and (c) at least one active region, wherein the or each active region is defined by a diffused region of the organic charge-transport layer arrangement into which at least one dopant has diffused, said diffused region extending only partly through the thickness of one of the said electron-transport region and hole-transport region, so as to form said layer arrangement, wherein the organic charge-transport layer arrangement comprises a single organic layer having the electron-transport region and hole-transport region extending into the layer from opposite surfaces thereof, and said at least one active region is diffused into the layer from one of said surfaces.

11. An organic opto-electronic structure comprising an organic charge-transport layer arrangement having (a) an electron-transport region at one surface, (b) a hole-transport region at an opposite surface, and (c) at least one active region, wherein the or each active region is defined by a diffused region of the organic charge-transport layer arrangement into which at least one dopant has diffused, said diffused region extending only partly through the thickness of one of the said electron-transport region and hole-transport region, so as to form said layer arrangement, wherein the structure is an electro-luminescent structure where the or each active region is a charge-carrier recombination/emitter region, wherein a plurality of localised active regions are provided which can be individually addressed.

12. An organic opto-electronic structure comprising an organic charge-transport layer arrangement having (a) an electron-transport region at one surface, (b) a hole-transport region at an opposite surface, and (c) at least one active region, wherein the or each active region is defined by a diffused region of the organic charge-transport layer arrangement into which at least one dopant has diffused, said diffused region extending only partly through the thickness of one of the said electron-transport region and hole-transport region, so as to form said layer arrangement, wherein the structure is a photovoltaic structure where the or each active region is a light absorption/charge-carrier separation region, wherein a single active regions is provided which extends over the majority of the length and width of the organic charge-transport layer arrangement.

* * * * *